United States Patent
Turner et al.

(10) Patent No.: US 6,864,557 B2
(45) Date of Patent: Mar. 8, 2005

(54) VERTICAL COLOR FILTER DETECTOR GROUP AND ARRAY

(75) Inventors: Richard M. Turner, Mountain View, CA (US); Richard F. Lyon, Los Altos, CA (US); Rudolph J. Guttosch, Los Gatos, CA (US); Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 148 days.

(21) Appl. No.: 10/103,304

(22) Filed: Mar. 20, 2002

(65) Prior Publication Data

US 2002/0190254 A1 Dec. 19, 2002

Related U.S. Application Data

(63) Continuation-in-part of application No. 09/884,863, filed on Jun. 18, 2001, now Pat. No. 6,727,521.

(51) Int. Cl.$^7$ ............................................... H01L 31/00
(52) U.S. Cl. ................... 257/440; 257/432; 257/443; 257/444
(58) Field of Search ................... 257/432, 440, 257/443, 444, 461, 294

(56) References Cited

U.S. PATENT DOCUMENTS

| | | | |
|---|---|---|---|
| 3,971,065 A | 7/1976 | Bayer | 358/41 |
| 4,011,016 A | 3/1977 | Layne et al. | 356/195 |
| 4,238,760 A | 12/1980 | Carr | 357/30 |
| 4,309,604 A | 1/1982 | Yoshikawa et al. | 250/226 |
| 4,613,895 A | 9/1986 | Burkey et al. | 358/41 |
| 4,651,001 A | 3/1987 | Harada et al. | 250/330 |
| 4,677,289 A | 6/1987 | Nozaki et al. | 250/226 |
| 4,772,335 A | 9/1988 | Huang | 136/258 |
| 5,397,734 A | 3/1995 | Iguchi et al. | 437/70 |
| 5,502,299 A | 3/1996 | Standley | 250/208.2 |
| 5,668,596 A | 9/1997 | Vogel | 348/222 |
| 5,739,562 A | 4/1998 | Ackland et al. | 257/291 |
| 5,872,371 A | 2/1999 | Guidash et al. | 257/230 |
| 5,883,421 A | 3/1999 | Chouikha et al. | 257/461 |
| 5,889,315 A | 3/1999 | Farrenkopf et al. | 257/552 |
| 5,899,714 A | 5/1999 | Farrenkopf et al. | 438/202 |
| 5,965,875 A | 10/1999 | Merrill | 250/226 |
| 6,078,037 A | 6/2000 | Booth, Jr. | 250/208.1 |

FOREIGN PATENT DOCUMENTS

| | | | |
|---|---|---|---|
| DE | WO 98/19455 | 5/1998 | H04N/3/15 |
| JP | 61 187282 | 8/1986 | H01L/31/10 |
| JP | 01 134966 | 5/1989 | H01L/27/14 |
| JP | 0605898 | 7/1994 | H01L/27/146 |

OTHER PUBLICATIONS

S. Chamberlain, "Photosensitivity and Scanning of Silicon Image Detector Arrays", *IEEE Journal of Solid–State Circuits*, vol. SC–4, No. 6, pp. 333–342, Dec. 1969.

R. Wolffenbuttel et al., "A Novel Approach to Solid–state Colour Sensing", *Sensors and Actuators*, vol. 9, pp. 199–211, 1986 (no month).

(List continued on next page.)

*Primary Examiner*—Minh-Loan Tran
(74) *Attorney, Agent, or Firm*—Sierra Patent Group, Ltd.

(57) ABSTRACT

A vertical color detector group according to the present invention is formed on a semiconductor substrate and includes layers for collecting photons of different wavelength bands. The color detector group can be programmed to perform dynamic switching between sub-sampled color data and full measured color readout. The color detector group can also be configured in a portion of an array to emulate color filter array patterns, and programmed to dynamically alter the degree to which color information is sub-sampled. The programmable color detector groups can allow for switching between different levels of quality and resolution, allowing for selection of an optimal pattern based on image content or lighting conditions. By combining the color detector group of the present invention with conventional color filters, color filter arrays of more than three colors can be constructed.

16 Claims, 19 Drawing Sheets

OTHER PUBLICATIONS

R. Wolffenbuttel et al., "Performance of an Integrated Silicon Colour Sensor with a Digital Output in Terms of Response to Colours in the Colour Triangle", *Sensors and Actualtors*, vol. A21–A23, pp. 574–580, 1990 (no month).

P. Scitz et al., "Smart optical and image sensors fabricated with industrial CMOS/CCD semiconductor processes", *SPIE*, vol. 1900, pp. 21–30, Jan. 1993.

J. Kramer, "Photo–ASICs: Integrated Optical Metrology systems with Industrial CMOS Technology", *Doctorial Dissertation: Diss Eth Nr. 10186*. MSc Imperial College of Science and Technology, pp. 44–47, 1993.

M. Chouikha, "Color sensitive photodetectors in standard CMOS and BiCMOS technologies", *SPIE*, vol. 2920, pp. 108–120, Aug. 1996.

H. Wong, "Technology and Devices Scaling Considerations for CMOS Imagers", *IEEE Transactions on Electron Devices*, vol. 43, No. 12, Dec. 1996.

K. Parulski, "Enabling technologies for a family of digital cameras", *SPIE*, vol. 2654, Paper 18, pp. 156–163, 1996 (no month).

B. Weibel, "High–end digital cameras can make professional indoor photography a snap", *Buyers Guide*, pp. 311–317, Apr. 1997.

D. Sutherland, "Neavcau Niche—Part 1: The Latest in digital SLRs", *Shutterbug*, pp. 200–209, Nov. 1997.

M. Chouikha, "Buried Triple p–n Junction Structure in a BiCMOS Technology for Color Detection", *IEEE BCTM 6,4*, pp. 108–111, 1997 (no month).

A. Theuwissen, "Fundamentals of Solid–State Imaging", *Solid–State Imaging with Charge–coupled Devices*, pp. 131–141, 1995 Reprinted with corrections 1996,1997.

R. Guidash, "A 0.6 um CMOS Pinned Photodiode Color Image Technology", *IEDM*, pp. 927–929, 1997 (no month).

D. Knipp, "Low Cost Approach to Realize Novel Detectors for Color Recognition", *Proc. ICPS 98* (International Congress on Imaging Science), pp. 350–353, Sep. 1998.

H. Miura, "A 100 Frame/s CMOS Active Pixel Sensor for 3D–Gesture Recognition System" 1999 IEEE International Solid–State Circuits Conference, pp. 142–143, Jun. 1999.

Stieblg et al., Transient Behavior of Optimized nipiin Three-Color Detectors, *IEEE Transactions on Electron Designs*, vol. 45, No. 7, pp. 1438–1443, Jul. 1998.

| RGB | RGB | RGB | RGB | RGB | RGB | RGB | RGB |
|---|---|---|---|---|---|---|---|
| ✕ |  | ✕ |  | ✕ |  | ✕ |  |
| RGB | RGB | RGB | RGB | RGB | RGB | RGB | RGB |
|  | ✕ |  | ✕ |  | ✕ |  | ✕ |
| RGB | RGB | RGB | RGB | RGB | RGB | RGB | RGB |
| ✕ |  | ✕ |  | ✕ |  | ✕ |  |
| RGB | RGB | RGB | RGB | RGB | RGB | RGB | RGB |
|  | ✕ |  | ✕ |  | ✕ |  | ✕ |
| RGB | RGB | RGB | RGB | RGB | RGB | RGB | RGB |
| ✕ |  | ✕ |  | ✕ |  | ✕ |  |
| RGB | RGB | RGB | RGB | RGB | RGB | RGB | RGB |
|  | ✕ |  | ✕ |  | ✕ |  | ✕ |

FIG. 5A

| RGB | RGB | RGB | RGB | RGB | RGB | RGB | RGB |
|---|---|---|---|---|---|---|---|
| ✕ | ✕ |  |  | ✕ | ✕ |  |  |
| RGB | RGB | RGB | RGB | RGB | RGB | RGB | RGB |
| ✕ | ✕ |  |  | ✕ | ✕ |  |  |
| RGB | RGB | RGB | RGB | RGB | RGB | RGB | RGB |
|  |  | ✕ | ✕ |  |  | ✕ | ✕ |
| RGB | RGB | RGB | RGB | RGB | RGB | RGB | RGB |
|  |  | ✕ | ✕ |  |  | ✕ | ✕ |
| RGB | RGB | RGB | RGB | RGB | RGB | RGB | RGB |
| ✕ | ✕ |  |  | ✕ | ✕ |  |  |
| RGB | RGB | RGB | RGB | RGB | RGB | RGB | RGB |
| ✕ | ✕ |  |  | ✕ | ✕ |  |  |

| B/G | R/G | B/G | R/G | B/G | R/G | B/G | R/G |
|---|---|---|---|---|---|---|---|
| R/G | B/G | R/G | B/G | R/G | B/G | R/G | B/G |
| B/G | R/G | B/G | R/G | B/G | R/G | B/G | R/G |
| R/G | B/G | R/G | B/G | R/G | B/G | R/G | B/G |
| B/G | R/G | B/G | R/G | B/G | R/G | B/G | R/G |
| R/G | B/G | R/G | B/G | R/G | B/G | R/G | B/G |

FIG. 8A

| R/G | B/G | R/G | B/G | R/G | B/G | R/G | B/G |
|---|---|---|---|---|---|---|---|
| B/G | R/G | B/G | R/G | B/G | R/G | B/G | R/G |
| R/G | B/G | R/G | B/G | R/G | B/G | R/G | B/G |
| B/G | R/G | B/G | R/G | B/G | R/G | B/G | R/G |
| R/G | B/G | R/G | B/G | R/G | B/G | R/G | B/G |
| B/G | R/G | B/G | R/G | B/G | R/G | B/G | R/G |

FIG. 8B

| B/G ✗ | R/G ✗ | B/G | R/G | B/G ✗ | R/G ✗ | B/G | R/G |
|---|---|---|---|---|---|---|---|
| R/G ✗ | B/G ✗ | R/G | B/G | R/G ✗ | B/G ✗ | R/G | B/G |
| B/G | R/G | B/G ✗ | R/G ✗ | B/G | R/G | B/G ✗ | R/G ✗ |
| R/G | B/G | R/G ✗ | B/G ✗ | R/G | B/G | R/G ✗ | B/G ✗ |
| B/G ✗ | R/G ✗ | B/G | R/G | B/G ✗ | R/G ✗ | B/G | R/G |
| R/G ✗ | B/G ✗ | R/G | B/G | R/G ✗ | B/G ✗ | R/G | B/G |

FIG. 8C

| R/G ✗ | B/G ✗ | R/G | B/G | R/G ✗ | B/G ✗ | R/G | B/G |
|---|---|---|---|---|---|---|---|
| B/G ✗ | R/G ✗ | B/G | R/G | B/G ✗ | R/G ✗ | B/G | R/G |
| R/G | B/G | R/G ✗ | B/G ✗ | R/G | B/G | R/G ✗ | B/G ✗ |
| B/G | R/G | B/G ✗ | R/G ✗ | B/G | R/G | B/G ✗ | R/G ✗ |
| R/G ✗ | B/G ✗ | R/G | B/G | R/G ✗ | B/G ✗ | R/G | B/G |
| B/G ✗ | R/G ✗ | B/G | R/G | B/G ✗ | R/G ✗ | B/G | R/G |

FIG. 8D

| BG | RG | BG | RG | BG | RG | BG | RG |
|---|---|---|---|---|---|---|---|
| RG | BG | RG | BG | RG | BG | RG | BG |
| BG | RG | BG | RG | BG | RG | BG | RG |
| RG | BG | RG | BG | RG | BG | RG | BG |
| BG | RG | BG | RG | BG | RG | BG | RG |
| RG | BG | RG | BG | RG | BG | RG | BG |

FIG. 11A

| RG | BG | RG | BG | RG | BG | RG | BG |
|---|---|---|---|---|---|---|---|
| BG | RG | BG | RG | BG | RG | BG | RG |
| RG | BG | RG | BG | RG | BG | RG | BG |
| BG | RG | BG | RG | BG | RG | BG | RG |
| RG | BG | RG | BG | RG | BG | RG | BG |
| BG | RG | BG | RG | BG | RG | BG | RG |

FIG. 11B

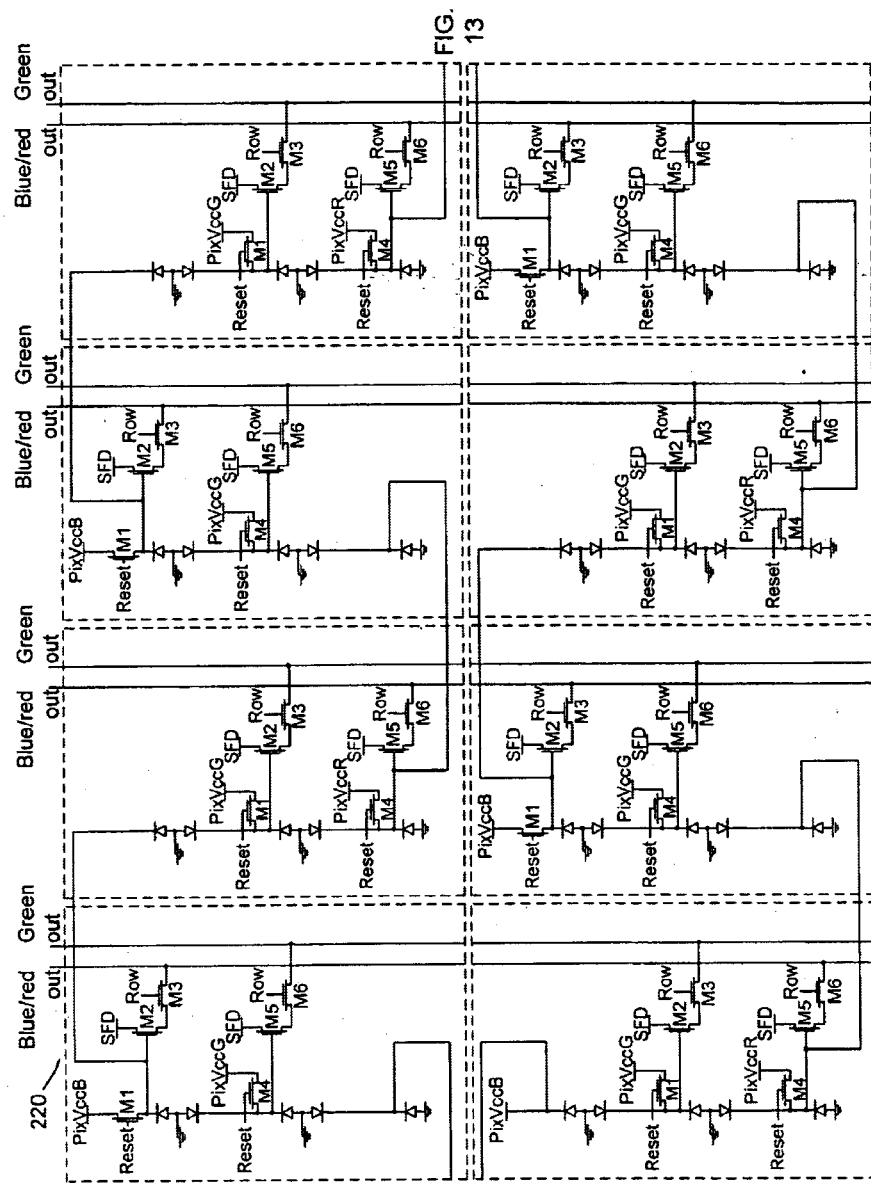

VERTICAL COLOR FILTER DETECTOR GROUP AND ARRAY

RELATED APPLICATIONS

This application is a continuation in part of U.S. patent application Ser. No. 09/884,863, entitled VERTICAL COLOR FILTER DETECTOR GROUP AND ARRAY, filed Jun. 18, 2001 now U.S. Pat. No. 6,727,521.

BACKGROUND OF THE INVENTION

1. Field of the Invention

The present invention relates to active pixel image sensors. More particularly, the present invention relates to full-color detector groups and arrays that use semiconductor material to chromatically filter light vertically and sense multiple wavelength bands at each cell or pixel location in an image sensor. The present invention also relates to such color detector groups configured in arrays and combined with circuitry so as to permit operation in various color subsampling modes as well as in full-color readout modes

2. The Prior Art

MOS active pixel sensors are known in the art. Multiple wavelength active pixel sensors are also known in the art. One type of multiple wavelength active pixel sensor employs red, green, and blue sensors disposed horizontally in a pattern at or near the semiconductor surface. Color overlay filters are employed to produce the color selectivity between the red, green, and blue sensors. Such sensors have the disadvantage of occupying a relatively large area per pixel as these sensors are tiled together in a plane. In addition, reconstruction of a color image from such a sensor is computationally intensive and often results in images with artifacts, defects, or inferior resolution.

Another type of multiple wavelength pixel sensor employs more than one sensor in a vertically-oriented arrangement. An example of an early multiple wavelength vertical pixel sensor for detecting visible and infra-red radiation is disclosed in U.S. Pat. No. 4,238,760 to Carr, in which a first diode in a surface n-type epitaxial region is responsive to visible light and a second buried p-region in an underlying n-type substrate is responsive to infrared radiation. Contact to the buried photodiode is made using deep diffusion processes similar to diffusion-under-film collector contact diffusion common in bipolar IC processing and for $R_{CS}$ reduction. The disclosed device has a size of 4 mils square. An alternate embodiment employs V-groove contacts to contact the buried p-type region of the infra-red diode.

The device disclosed in the Carr patent has several shortcomings, the most notable being its large area, rendering it unsuitable for the image sensor density requirements of modern imaging systems. The technology employed for contact formation to the buried infrared sensing diode is not suitable for modern imaging technology or extension to a 3-color sensor.

A particular example of a three-color visible-light prior art vertical pixel sensor group is disclosed in U.S. Pat. No. 5,965,875 to Merrill in which a structure is provided using a triple-well CMOS process wherein the blue, green, and red sensitive PN junctions are disposed at different depths beneath the surface of the semiconductor substrate upon which the imager is fabricated.

This prior three-color sensor group permits fabrication of a dense imaging array because the three colors are sensed over approximately the same area in the image plane. However, this structure has several shortcomings. First, this pixel sensor group uses a reverse-polarity central green-sensitive PN junction, requiring modified circuits or voltage ranges, possibly involving PMOS transistors in addition to the usual NMOS transistors, to sense and read out the green channel. This requirement disadvantageously increases sensor area and complicates support circuits in the array. The added circuit complexity makes it difficult to make an image sensor array that has the flexible color readout capabilities disclosed in this invention and makes it impossible to achieve the small pixel sizes required by many modern electronic imaging applications.

A color detection active pixel sensor is disclosed in U.S. Pat. No. 6,111,300 to Cao et al. Cao discloses a color pixel that uses a PIN photodiode above the pixel to attempt to collect blue light, and two additional semiconductor junction diodes within the semiconductor substrate which are designed to detect green and red light. Among the shortcomings of this disclosure are difficult and non-standard manufacturing techniques, use of structures that prohibit high density of pixels, no ability to select different colors for read out, and inability to perform detection of three or more colors using a monolithic semiconductor substrate.

Findlater et al. ("A CMOS Image Sensor Employing a Double Junction Photodiode," K. M. Findlater, D. Renshaw, J. E. D. Hurwitz, R. K. Henderson, T. E. R. Bailey, S. G. Smith, M. D. Purcell, and J. M. Raynor, in 2001 IEEE Workshop on Charge-Coupled Devices and Advanced Image Sensors, IEEE Electron Devices Society (2001)) disclose an active pixel sensor that employs a double junction photodiode in conjunction with an organic filter overlay. The performance of this sensor is limited by the poor color response of the double junction photodiode and by the fact that the n-well forms the cathode of both photodiodes, making this pixel design very susceptible to non-linear crosstalk between the color channels. Additionally, the authors cite non-uniformity and process/fabrication constraints that limit the performance and potential benefits of this design.

None of the prior art discussed above provides any mechanism for dynamic control of the color filter array pattern. Also, the aforementioned prior art does not enable choosing between full-measured color and sub-sampled color. Further limitations are that the prior art discussed above does not disclose a practical way to make a color imaging array containing more than three distinct spectral sensitivities.

BRIEF DESCRIPTION OF THE INVENTION

The present invention provides a color detector group that can be employed in an array of color detector groups to construct color filter array type sensors. The color detector group uses the properties of semiconductor materials to detect incident illumination as is well known in the prior art and, additionally, to selectively detect incident illumination of different wavelengths. The detection of different wavelengths is possible due to the vertical placement of the detector layers of the detector group in combination with the variation of optical absorption depth with wavelength in semiconductor materials. Because the color detector group does not require external color filters, as are traditionally used in color image sensors, the manufacturing costs are substantially reduced. In addition, the spectral response characteristics of the color detector group of the present invention are much more stable and less sensitive to external factors such as temperature or other environmental factors that may be present during or after manufacturing. The color detector group of the present invention is capable of being programmed to dynamically alter the degree to which color information is sub-sampled, to alter the arrangement of the color filter array pattern formed by the color detector group array, and to switch between full measured color readout and sub-sampled color readout. Color detector groups of the present invention can be used to create pixels that are sensitive to one, two, three or more than three distinct spectral ranges. By combining traditional color filters with the color detector groups of the present invention, new types of color sampling arrays are created, such as filter arrays that use more than three colors or arrays that tune the filter responses to obtain a wider variety of color characteristics.

A vertical color filter detector group according to the present invention is formed on a semiconductor substrate and comprises a plurality of detector layers configured by doping and/or biasing to collect photo-generated carriers of a first polarity, preferably negative electrons, separated by additional intervening reference layers configured to collect and conduct away photo-generated carriers of the opposite polarity, preferably positive holes. The detector layers have different spectral sensitivities based on their different depths in the semiconductor substrate, doping levels and biasing conditions. The detector layers are individually connected to active pixel sensor readout circuits. In one example of such a detector group, each detector group includes a blue photodetector n-type layer at the surface of the semiconductor, a green photodetector n-type layer deeper in the semiconductor, and a red photodetector n-type layer deepest in the semiconductor. The blue photodetector at the surface of the semiconductor may optionally have a reference layer only below it, while the red and green photodetectors have reference layers above and below their detector layers. Such detector groups and methods for fabricating them are discussed more fully in the parent specification, U.S. patent application Ser. No. 09/884,863.

In one aspect, the present invention provides a color detector group that includes circuitry for converting photons from blue, green and red illumination into electrical signals delivered along separate column output lines. Circuitry is implemented at a column decoder to allow for selection of each column output line on to an output bus or on to multiple output busses, thereby permitting selection of signals corresponding to different colors. Programming the order of color readout through multiplexing the column output lines results in a sensor that can either read out different color filter array patterns, such as a Bayer pattern, or read out full measured color data.

Color detector groups of the present invention can be configured into an array of color detector groups, such as a mosaic sensor group having two rows of color detector groups, each row having two color detector groups. In this embodiment, each color detector group is configured to read out only one wavelength band, but the color filters for blue, green and red are all active. The color filter responses of the detector layers in combination with the choice of which detector layer is connected to the read out circuit determines which wavelength band is sensed by a given detector group. The array of this embodiment produces a fixed color filter array pattern based on three colors. By reading out only one color per pixel location, significant reductions in circuitry and wiring can be realized resulting in higher yield and therefore reduced cost, and simplifying the interface to systems that require color sub-sampled data as input. Reduced circuitry and wiring per color detector group location also results in increased fill factor per pixel location, thus providing superior image sensor performance by increasing the signal to noise ratio and improving dynamic range.

In another embodiment, the present invention provides a mosaic detector group that allows a color filter array pattern, such as a Bayer pattern, to be switched between two different states. Switching the color filter array pattern enables increased resolution in interpolated images by capturing two color sub-sampled images and combining them. In addition, the ability to change the color filter array pattern simplifies integration of the array with other components of a system configured to work with a particular orientation or type of color filter array pattern. In this embodiment, color filter detector groups are configured in a mosaic detector group having two rows and two columns of color detector groups, each color detector group configured to read out two wavelength bands, but with the color filters for blue, green and red all active and further, the circuits for reading out the two wavelength bands sharing a common column output line. The column output lines are shared among color detector groups that lie along the same column of the mosaic detector group. Programming the mosaic detector group to switch between wavelength bands on each color detector group provides the switching between different color filter array states.

In yet another embodiment, color detector groups of the present invention can be configured in a mosaic detector group that uses color sub-sampling in two channels, but full sampling in a third channel. In this embodiment, the color detector group of the present invention is configured into a two row, two column array of detector groups, wherein each color detector group is configured to read out two wavelength bands, but with the color filters for blue, green, and red all active. The signals corresponding to each of the two wavelength bands are output on separate column output lines, the column output lines being shared by color detector groups that lie along the same column of the mosaic detector group. In this embodiment, two colors can be collected at each pixel location. In one case of this embodiment, the red and blue wavelength bands can be sub-sampled by sensing red or blue illumination at alternate color detector group locations within the detector group array, while the green wavelength band can be sensed at every location. This provides high resolution and reduced aliasing while still maintaining some of the benefits of reading out only two colors per pixel, the primary benefit being reduced complexity of readout circuits which leads to better yield and increased fill factor.

Each of the disclosed embodiments of arrays of color detector groups can optionally be modified by the addition of a pattern of optical color filters applied over the array. Using only a single filter material, an array with three detectors per detector group can be augmented to detect light with 4, 5, or 6 different spectral sensitivity ranges, to yield potentially improved color accuracy. The filter material may be an organic dye filter as in prior-art color image sensors, or it may be a layer than can be integrated into the semiconductor fabrication process, such as either a layer of polysilicon to absorb short wavelengths, or a stack of alternating oxide and nitride layers to shape the spectral response by interference effects. Other interference-based dielectric filter stacks are also possible in conjunction with the color detector groups of the present invention. While use of a single filter material permits up to 6 different spectral sensitivities, the present invention is in no way limited to the use of a single filter material, and color sensor arrays that employ color detector groups of the present invention in combination with color filters that have multiple different spectral transmission characteristics are possible and may be desirable for certain applications.

Other features and advantages of the present invention will be realized by those skilled in the art from reading the following detailed description with reference to the figures.

BRIEF DESCRIPTION OF THE DRAWING FIGURES

FIG. 5 is a schematic illustrating multiple color detector groups of FIGS. 4A and 4B in an array utilizing color filters disposed above some of the color detector groups.

FIGS. 8A–8B are schematics illustrating multiple color detector groups of FIG. 7 in arrays utilizing color filters disposed above some of the color detector groups.

FIGS. 11A and 11B are schematics illustrating multiple color detector groups of FIG. 10 in arrays utilizing color filters attached to some of the color detector groups.

FIG. 13 is a schematic of an array of color detection groups having larger blue and red collection areas.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

Figure 2A:
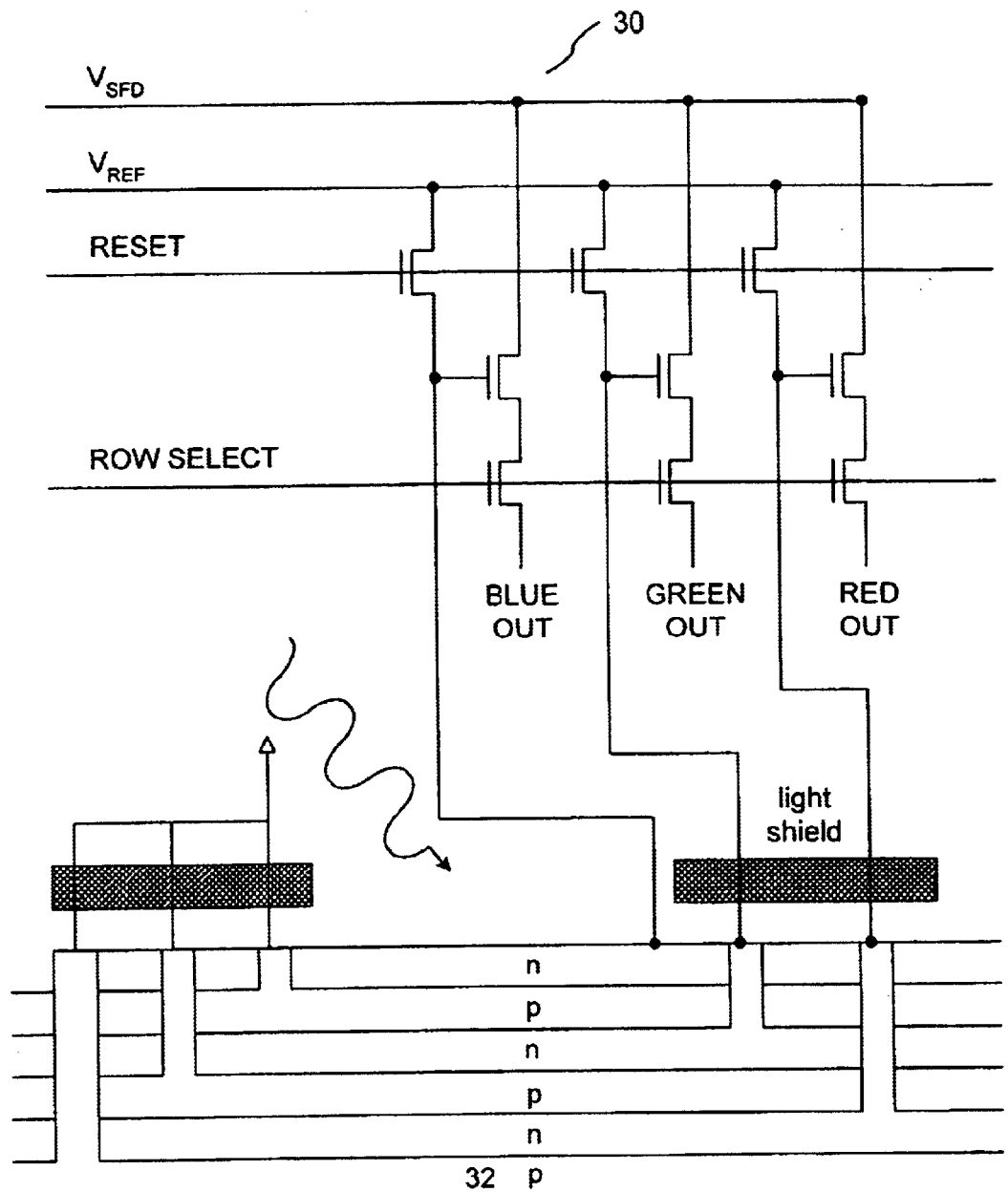
FIG. 2A is a combination semiconductor cross sectional diagram and schematic diagram of a vertical color filter pixel sensor according to the present invention.

FIG. 2A illustrates an illustrative and non-limiting example of a color detector group that may be used to practice the present invention. Color detector group 30 is a six-layer structure that is shown schematically in cross-sectional view fabricated on p-type semiconductor substrate 32. This type of vertical color filter detector group has three n-type regions, isolated vertically by p-regions that are all connected to the substrate potential.

Figure 1:
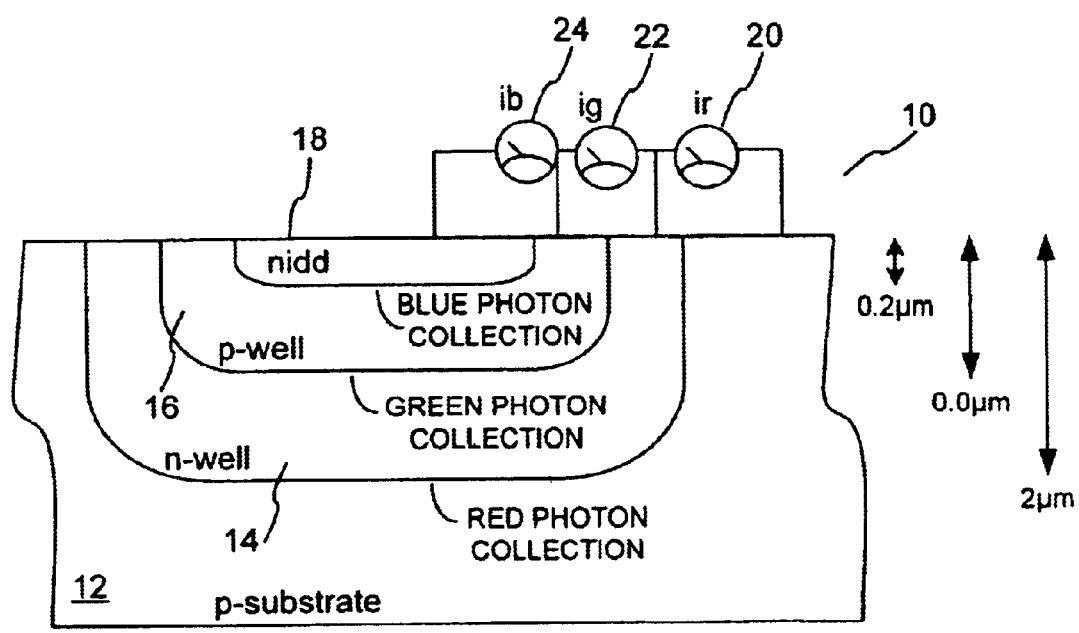
FIG. 1 is a cross-sectional view of a prior-art three-color vertical color filter pixel sensor.
Figure 2B:
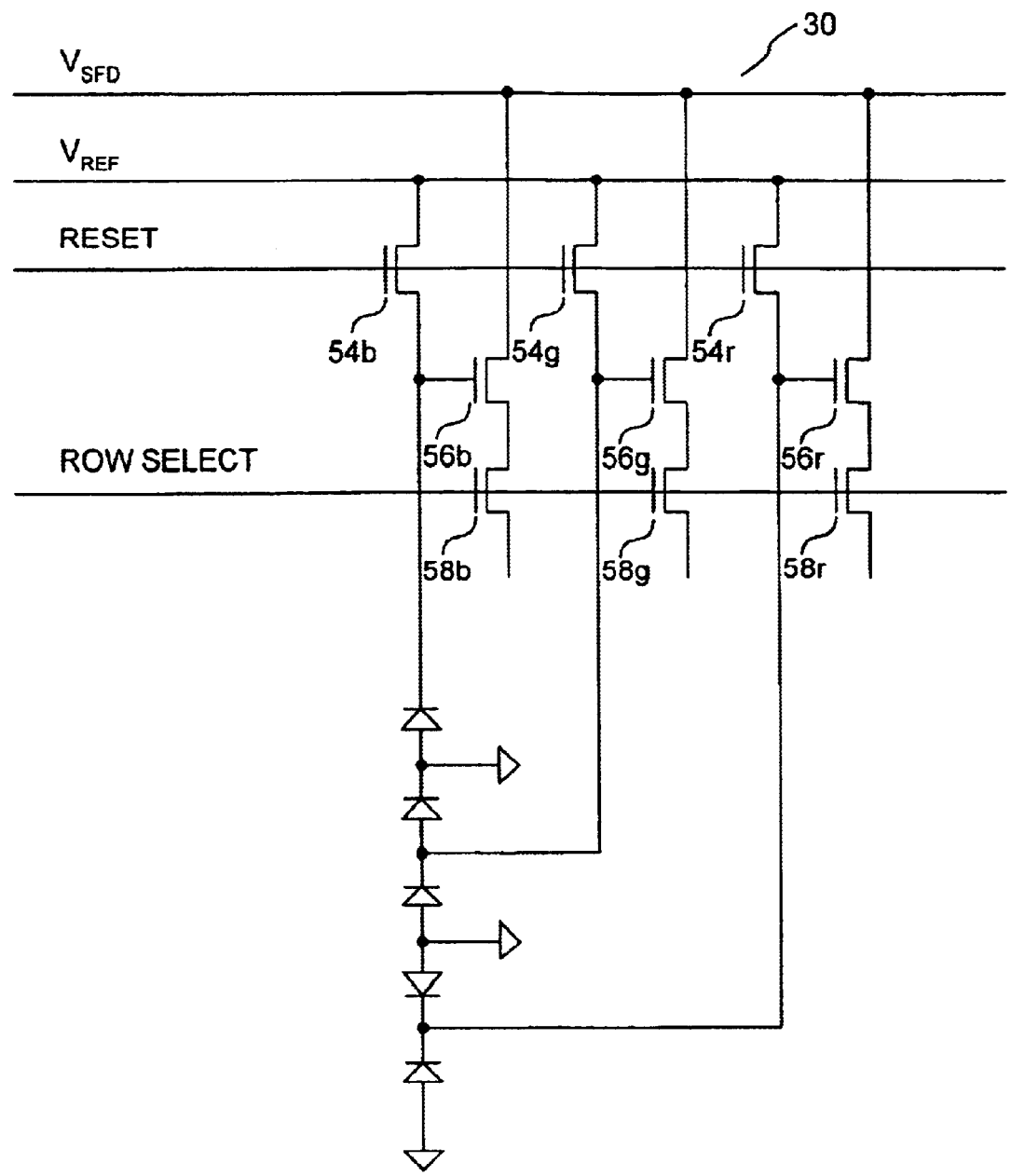
FIG. 2B is a combination semiconductor cross sectional diagram and schematic diagram depicting the same vertical color filter pixel sensor as shown in FIG. 2A in which the photodiodes are represented schematically as semiconductor diode symbols.

The blue, green, and red photodiode sensors are formed by the junctions between the n-type and p-type regions, and are disposed at different depths beneath the surface of the semiconductor structure. In comparison to the structure of FIG. 1., the addition of the extra layers results in a structure in which the red, green, and blue photocurrent signals are all taken from the n-type cathodes of three isolated photodiodes. This is shown schematically in FIG. 2B, which depicts the same vertical color filter detector group as shown in FIG. 2A. In FIG. 2B the photodiodes are represented schematically as semiconductor diode symbols.

Both FIGS. 2A and 2B show a non-storage version of a vertical color filter pixel in which each of the red, green, and blue photodiodes is coupled to a transistor circuit. Each circuit has a reset transistor 54 driven from a RESET signal line and coupled between the photodiode cathode and a reset potential VREF, a source-follower amplifier transistor 56 coupled to the photodiode cathode, and a row-select transistor 58 driven from a ROW-SELECT signal line and coupled between the source of the source follower amplifier transistor and a row line. The suffixes "r," "g," and "b" are used to denote the color associated with each transistor. As is known in the art, the RESET signal is active to reset the pixel and is then inactive during exposure, after which the row select line is activated to read out the pixel data.

Figure 2C:
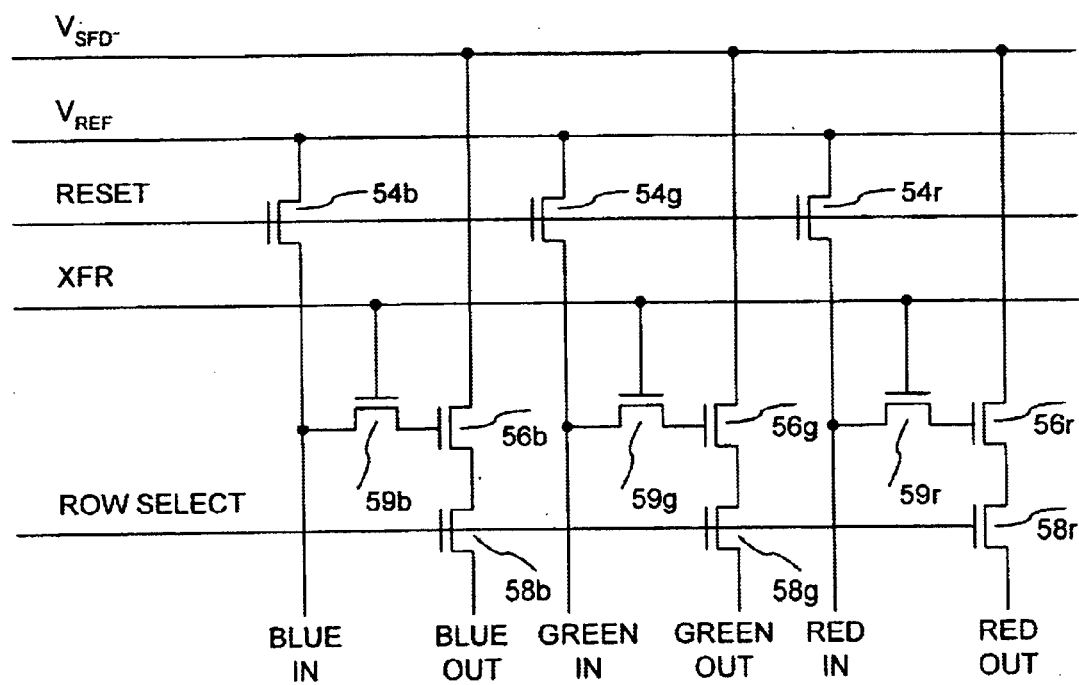
FIG. 2C is a schematic diagram depicting transistor circuitry that may be used in a storage version of the vertical color filter pixel of the present invention to which each of the red, green, and blue photodiodes is coupled.

Referring now to FIG. 2C, a schematic diagram depicts transistor circuitry that may be used in a storage version of the vertical color filter pixel of the present invention to which each of the red, green, and blue photodiodes is coupled. As will be appreciated by persons of ordinary skill in the art, the transistor circuit of FIG. 2C includes an additional transfer transistor 59 not found in the circuits of FIGS. 2A and 2B. The gate of transfer transistor 59 is coupled to a XFR line that is held active for at least part of the time that the RESET line is active and goes inactive at the end of the exposure time, after which the row select line is activated to read out the pixel data. One advantage of the circuit of FIG. 2C is that the use of the transfer transistors eliminates the need for a mechanical shutter.

From the disclosure herein, persons of ordinary skill in the art will recognize that there are numerous ways to realize vertical color filter detector groups in a semiconductor structure. For example, the six-layer structure of alternating p-type and n-type regions can be formed using a semiconductor substrate as the bottom layer and forming five concentric wells of alternating conductivity type in the substrate.

Figure 3:
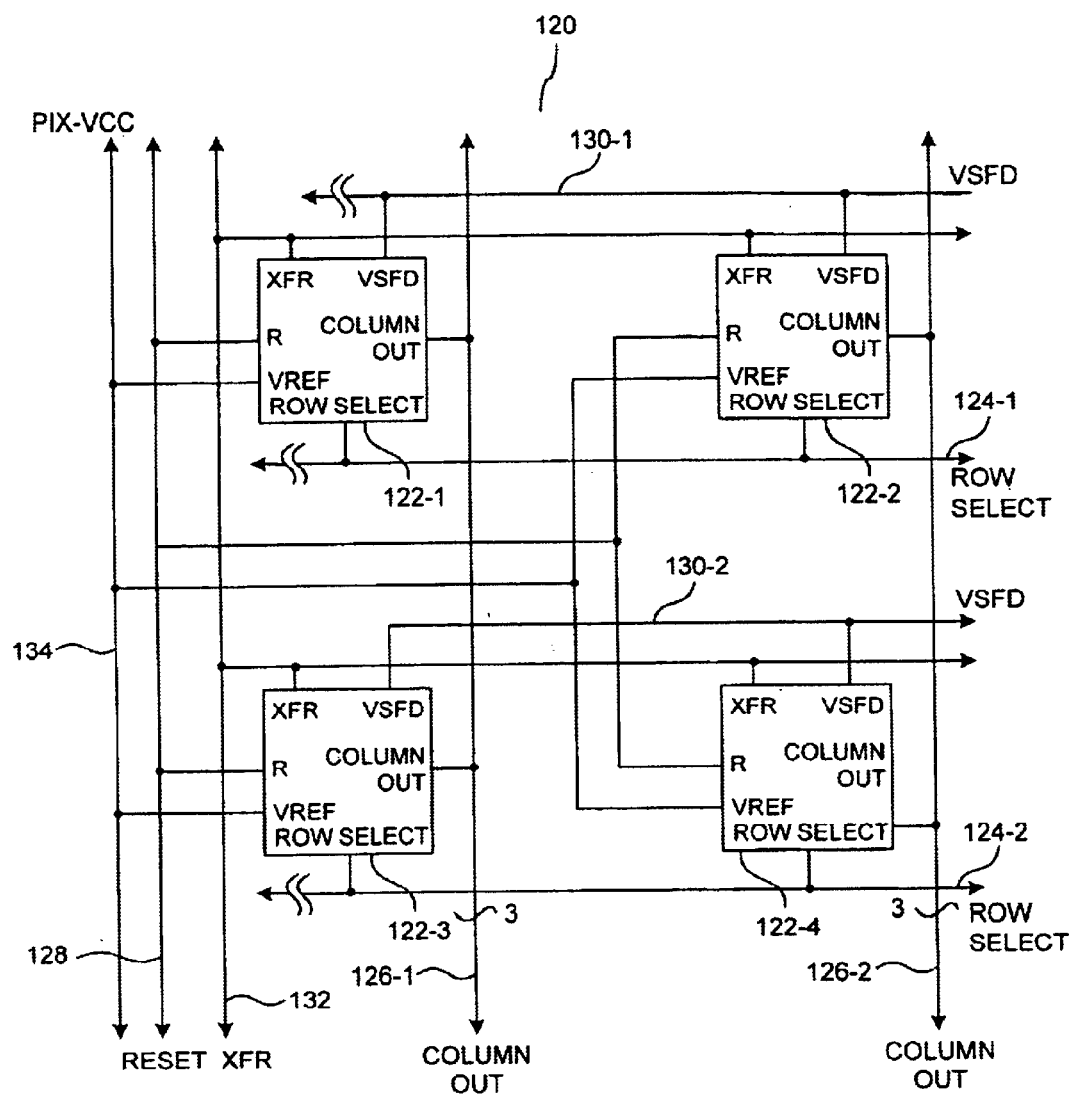
FIG. 3 is a diagram of an imaging array that can be used in accordance with the present invention.

Referring now to FIG. 3, a diagram shows an illustrative 2 by 2 portion 120 of an array of vertical color filter detector groups that may be used in accordance to the present invention. Persons of ordinary skill in the art will readily appreciate that the array portion disclosed in FIG. 3 is illustrative only and that arrays of arbitrary size may be fabricated using the teachings herein. The illustrative array example of FIG. 3 employs circuitry with a storage feature such as is depicted in FIG. 2C including a transfer transistor and so includes a global transfer signal line serving the array. Persons of ordinary skill in the art will appreciate that arrays employing circuitry similar to that depicted in FIGS. 2A and 2B without storage and thus without a transfer transistor are also contemplated as within the scope of the present invention and that such arrays will not include a transfer signal line.

Common RESET and XFR lines can be provided for all of the vertical color filter detector groups in the array. As presently preferred, a separate VSFD line is provided for each row in the array, although embodiments of the present invention having a single VSFD node are also contemplated. Additionally, it is possible to employ a separate VREF potential for each of the three colors of the detector groups in an array, or to simplify the wiring by connecting the VSFD and VREF signals into a single global node in an array of color detector groups. Referring to FIGS. 2A through 2C, the source of the row select transistor for each color in a column of the array will be coupled to a separate line associated with that column and the gate of all row select transistors for all colors for each vertical color filter detector group in a row of the array will be coupled to a ROW-SELECT line associated with that row.

The 2 by 2 portion 120 of the array in FIG. 3 includes two rows and two columns of vertical color filter detector groups. A first row includes vertical color filter detector groups 122-1 and 122-2; a second row includes vertical color filter detector groups 122-3 and 122-4. A first column includes vertical color filter detector groups 122-1, 122-3; a second column includes vertical color filter detector groups 122-2 and 122-4.

A first ROW-SELECT line 124-1 is connected to the row-select inputs (ROW-SELECT) of vertical color filter detector groups 122-1 and 122-2. A second ROW-SELECT line 124-2 is connected to the row-select inputs (ROW-SELECT) of vertical color filter detector groups 122-3 and 122-4. The first and second ROW-SELECT lines may be driven from a row decoder (not shown) as is well known in the art.

A first set of three (blue, green, and red) "COLUMN OUT lines" 126-1 is connected to the outputs of vertical color filter detector groups 122-1 and 122-3. A second set of three COLUMN OUT lines 126-2 is connected to the outputs of vertical color filter detector groups 122-2 and 122-4. The first and second sets of COLUMN OUT lines are coupled to sets of column readout circuits (not shown) similar to circuits that would be used with prior-art single-output active pixel sensors.

A global RESET line 128 is connected to the reset (R) inputs of all of the vertical color filter detector groups 122-1 through 122-4. A first VSFD line 130-1 is connected to the VSFD inputs of the vertical color filter detector groups 122-1 and 122-2 in the first row of the array. A second VSFD line 130-2 is connected to the VSFD inputs of the vertical color filter detector groups 122-3 and 122-4 in the second row of the array. A global XFR line 132 is connected to the XFR inputs of all of the vertical color filter detector groups 122-1 through 122-4.

A global VREF line 134 is connected to the VREF inputs of all of the vertical color filter detector groups 122-1 through 122-4. Alternately, multiple VREF lines (one for each column) could be provided.

Figure 4A:
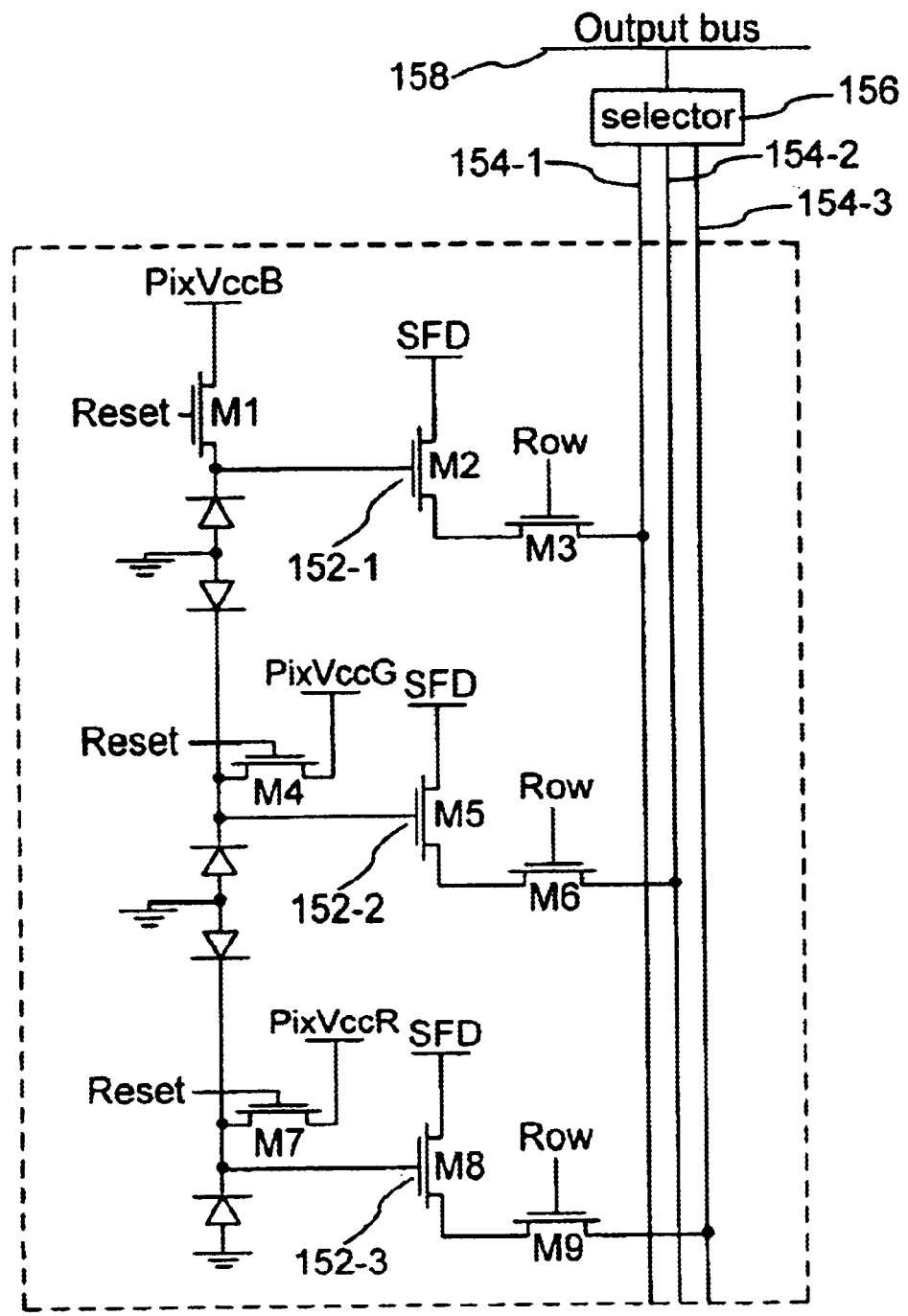
FIG. 4A is a schematic illustrating a color detector group capable of being programmed to read out full measured color data or combined with other color detector groups to emulate a color filter array pattern.

Directing attention to FIG. 4A, the color detector group 150 is similar to the color filter detector group 30 discussed above. Circuit 152-1 converts photogenerated carriers resulting from blue illumination to electrical signals such as current signals or voltage signals and feeds them to blue column output line 154-1. Circuit 152-2 converts photogenerated carriers resulting from green illumination to electrical signals such as current signals or voltage signals and feeds it to green column output line 154-2. Circuit 152-3 converts photogenerated carriers resulting from red illumination to electrical signals such as current signals or voltage signals and feeds them to red column output line 154-3. To emulate a color filter array pattern, circuitry is implemented at a column selector 156 to allow for individual selection of each electrical signal from the column output lines 154 onto an output bus 158. By introducing intelligence into the circuitry of the column decoder 156, thereby enabling the column decoder 156 to multiplex the column output lines 154, the order of color readout is made programmable. This results in a sensor that can read out different color filter array patterns, or can read out full measured color data.

Figure 4B:
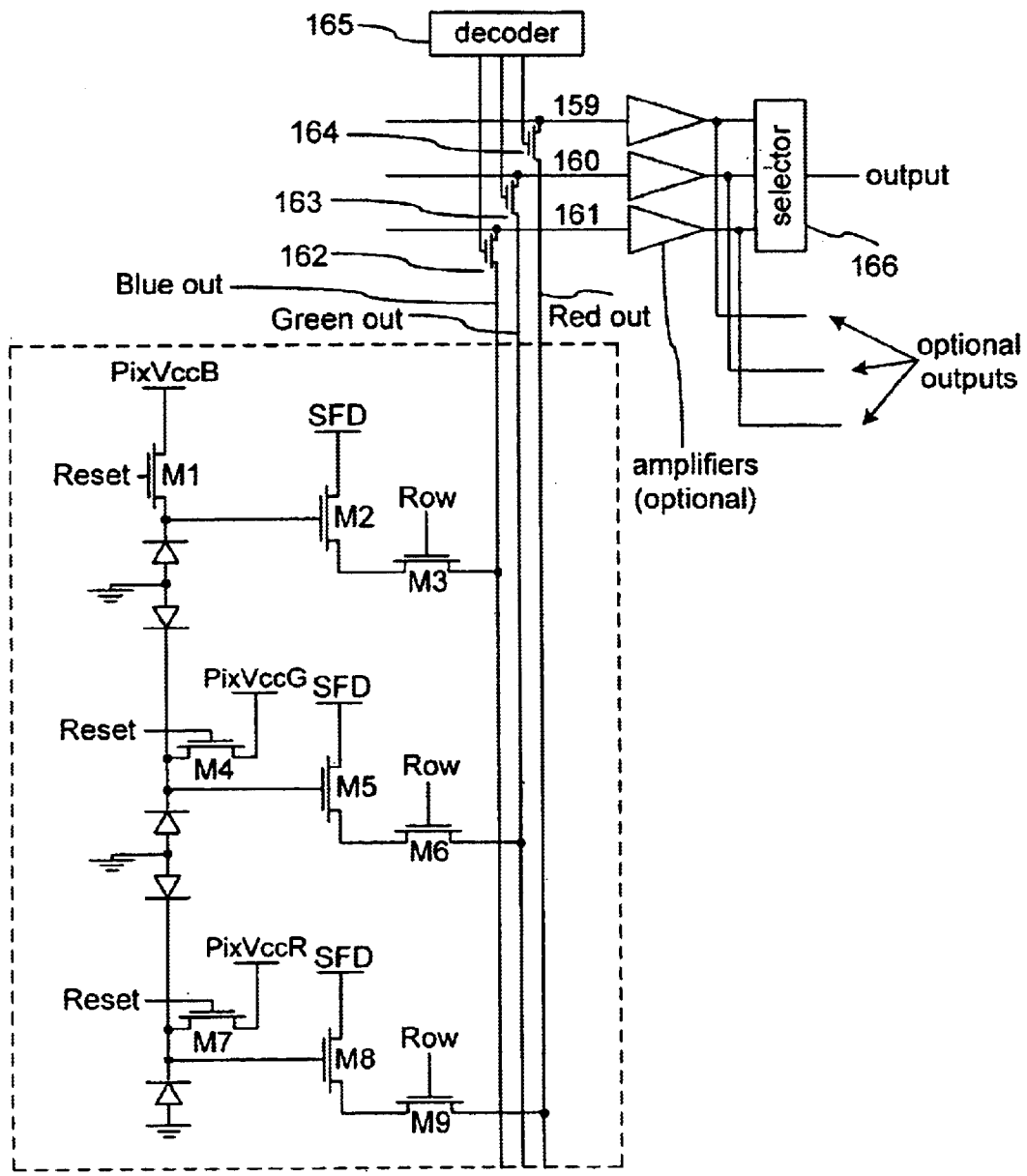
FIG. 4B is a schematic illustrating the color detector group of FIG. 4A wherein the three color outputs can be read out in parallel fashion, serial fashion, or in a mode that emulates a color filter array pattern.

An alternative implementation of color detector group 150 is shown in FIG. 4B. In this embodiment, the detector group circuits and column output lines are similar to those shown in FIG. 4A. Instead of a single output bus, there are now three output buses 159, 160, 161, one corresponding to each color. The column output lines from each of the columns in the array can be switched onto the output buses by means of switches 162, 163, 164 controlled by a selector 165. The output buses connect to a selector 166 that controls which of the buses are selected and therefore controls how the data is read out of the sensor. Optionally, the outputs corresponding to the three buses can directly sensed thereby permitting simultaneous sensing of the signals. This arrangement allows for a design wherein all three colors can be read out in parallel or serial, or a color filter array can be emulated that reads out one color at a time.

Figures 5C, 5D:
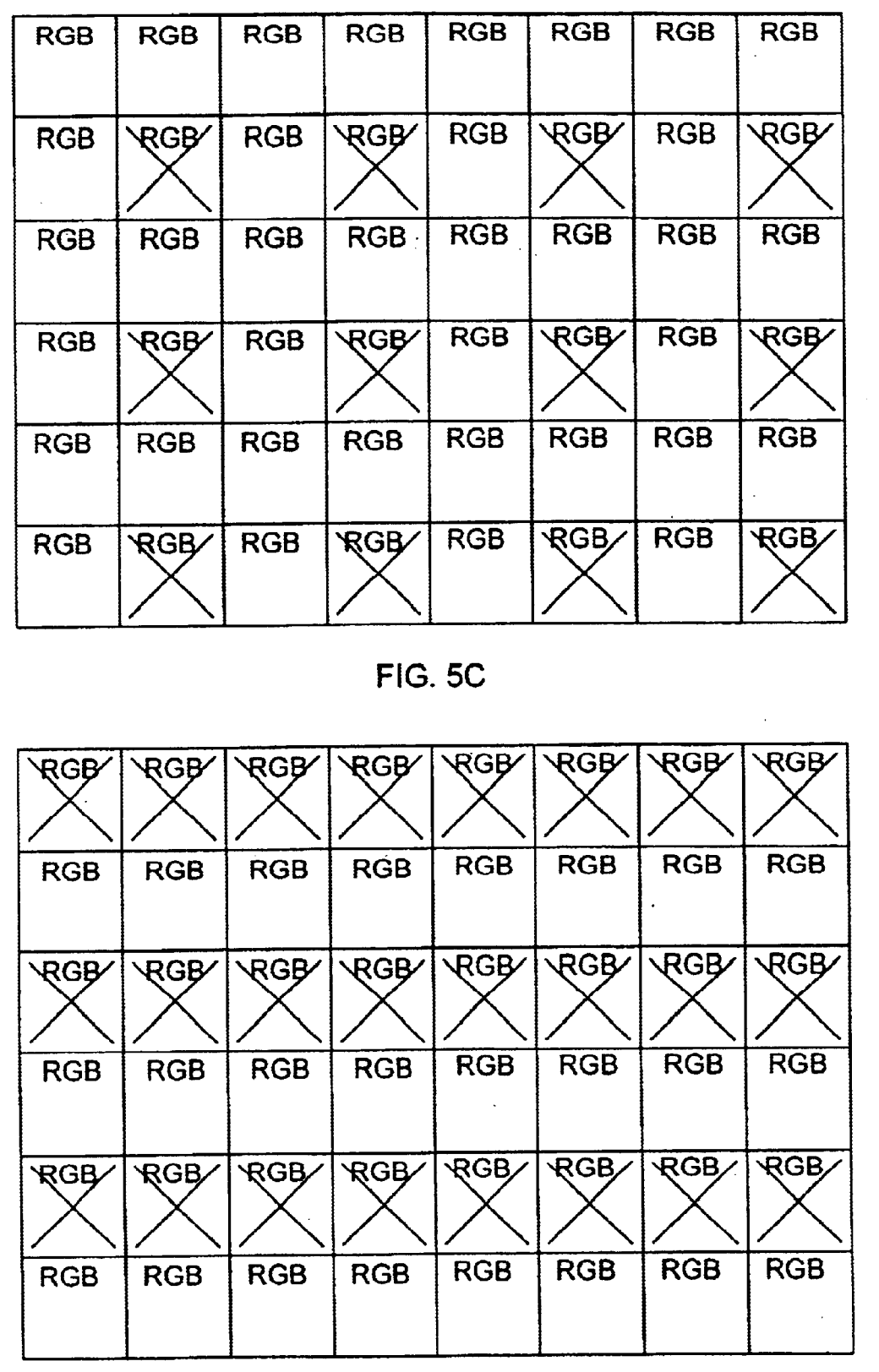
Figures 5E, 5F:
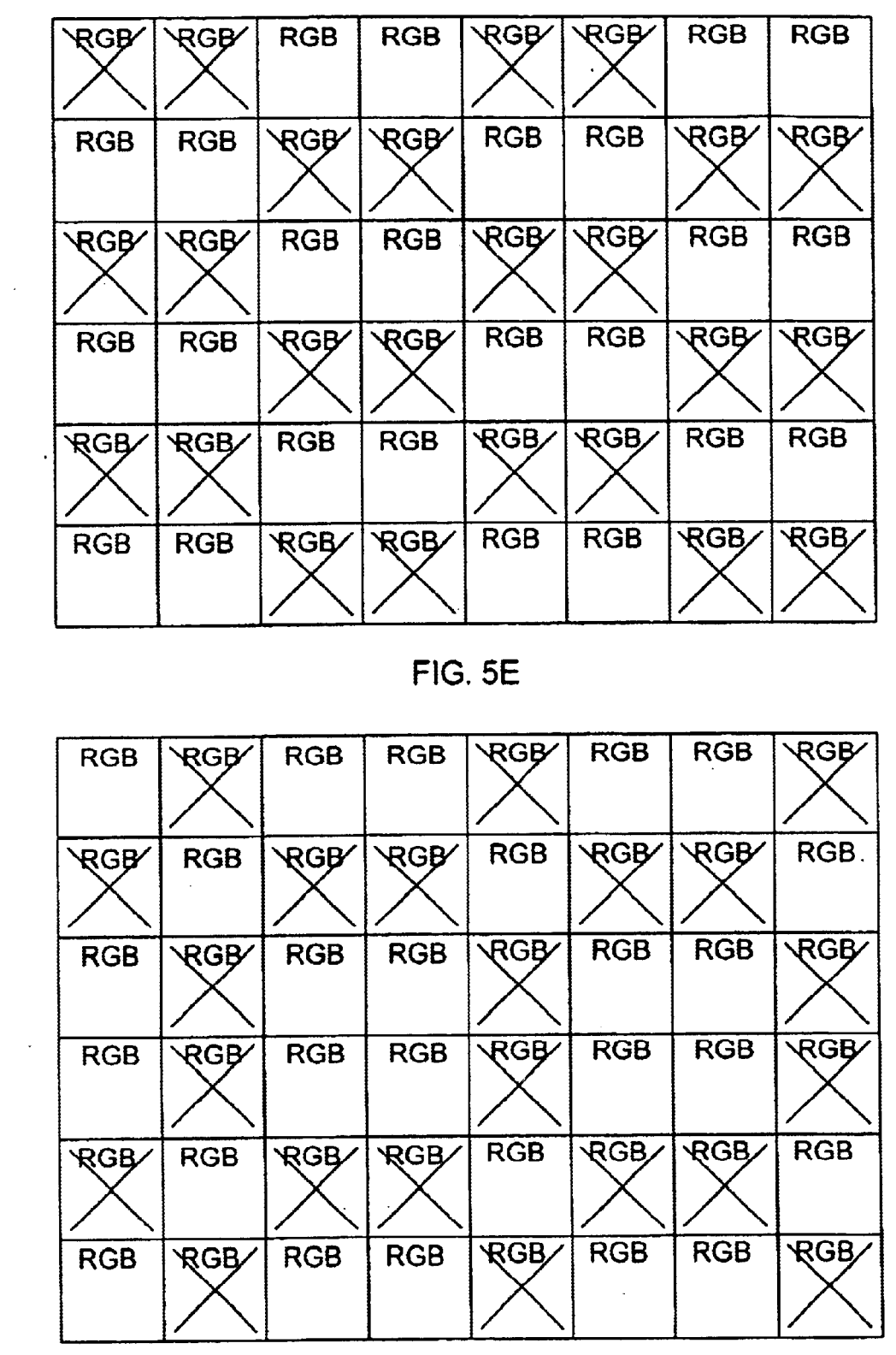

FIGS. 4A and 4B indicate how a single detector group might be connected. As illustrated in FIGS. 5A–5F, multiple detector groups 150 can be connected, optionally with color filters represented by a large X within the color detector group. The color filters indicated by the X markers can be organic, dielectric, polysilicon, or other types of color filters. In a preferred embodiment shown in FIG. 5A, color filters are distributed among color detector groups in an alternating or "checkerboard" manner, thus obtaining optimal spatial frequency between color detector groups connected to color filters and color detector groups not connected to color filters. In FIG. 5B, the color filters are distributed in a manner that permits both full-measured color readout and mosaic emulation readout, while guaranteeing that both types of image readouts contain every combination of color detector group output and color filter. FIGS. 5C, 5D, 5E, and 5F illustrate other color detector group and color filter combinations that offer the ability to make a sensor array with up to 6 different color response characteristics distributed among the pixels of the array.

Programming the order of color readout is desirable because it can allow for switching between different levels of quality and resolution, and can provide dynamic control of the color filter array pattern, thus enabling selection of an optimal pattern based on factors such as image content or lighting conditions.

Figure 6:
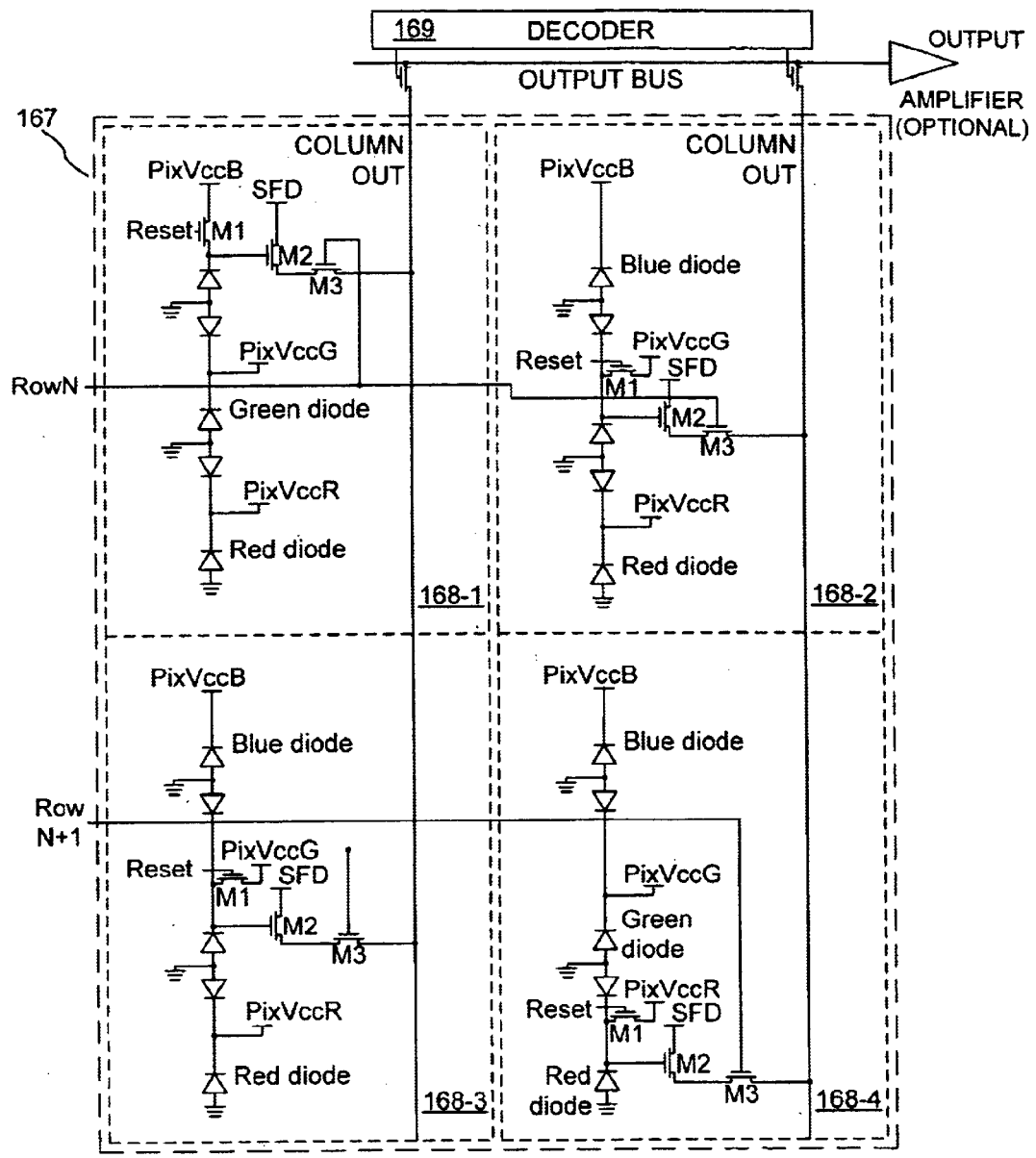
FIG. 6 is a schematic of a mosaic of color detector groups configured to emulate a color filter array pattern.

In an embodiment of the present invention illustrated in FIG. 6, implementation of a traditional color filter array pattern, such as a Bayer pattern, is achieved by combining four color detector groups in a sub-array 167 having two rows and two columns. The outputs from the detectors of a given row can be selected onto the shared column output lines through the row select transistors, and the column output lines can be multiplexed onto an output bus by means of a decoder 169. Although the color filters for all three colors blue, green and red are active, each color detector group 168-1 through 168-4 is wired to read out a single color. As illustrated, color detector group 168-1 reads out a blue signal, color detector groups 168-2 and 168-3 read out a green signal, and color detector group 168-4 reads out a red signal. In this way, each color detector group functions as a pixel that collects only one wavelength band that is determined by the color filter responses of the photodetectors that exist at each pixel location. Sub-array 167 results in a fixed color mosaic pattern, and this sub-array can be incorporated into a larger array of color detector groups to form an image sensor that generates an output signal similar to that generated by a traditional color filter array-based image sensor. In FIG. 6, a Bayer pattern is shown, but any pattern that is based on a three color filter array can be implemented. In comparison to traditional color filter methods, using the color detector groups 168-1 through 168-4 in this manner offers the aforementioned benefits of lower manufacturing costs, more stable color filters, and easy interface to systems that require color sub-sampled data as input. Additionally, by reading out only one color channel per pixel location, two thirds of the required circuitry and wiring can be eliminated from groups in the array in comparison to color detector group 150, thus increasing the fill factor within each pixel location. Increased fill factor results in improved image sensor performance in terms of noise reduction and dynamic range.

Figure 7:
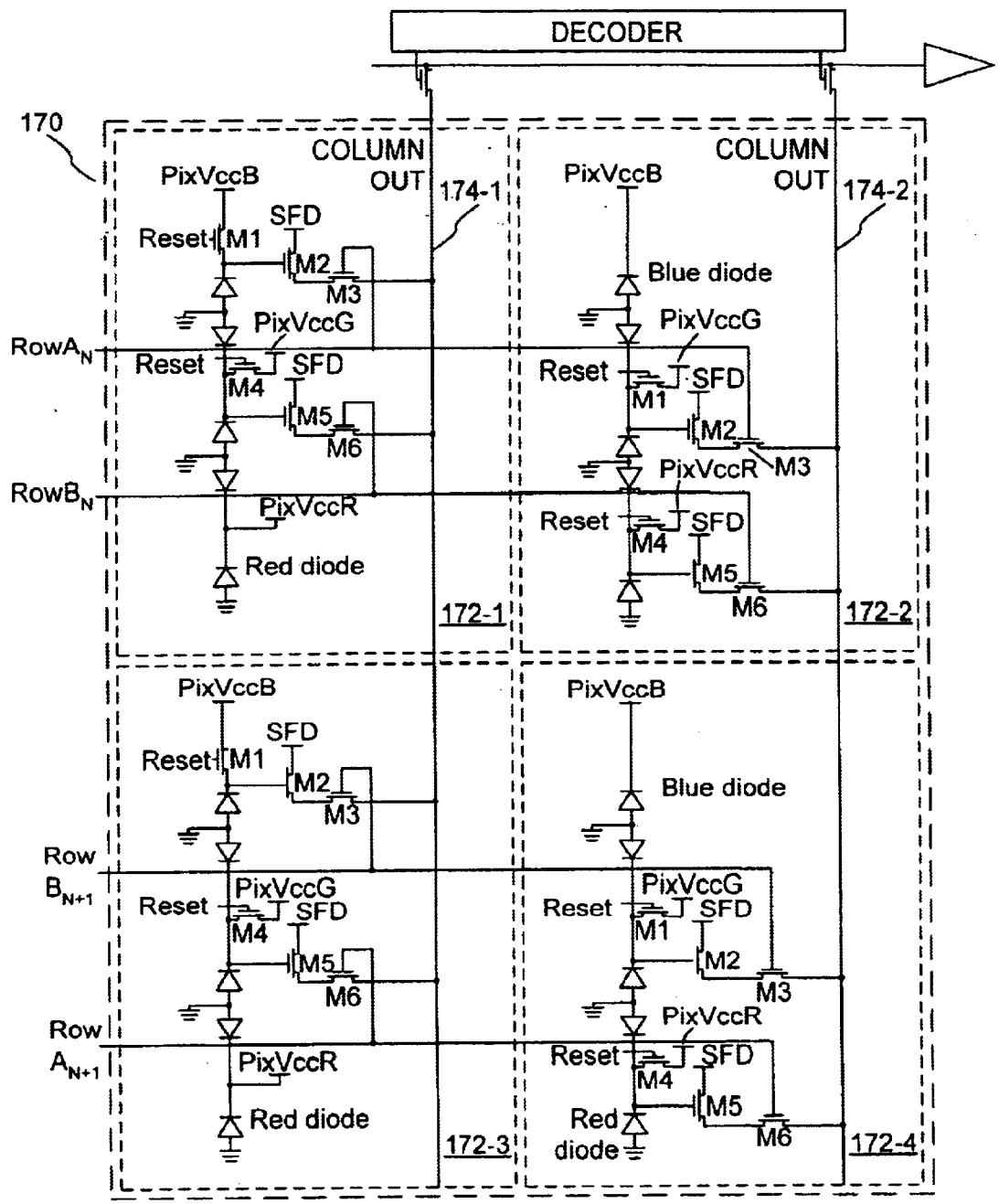
FIG. 7 is a schematic of a mosaic of color detector groups that allows an emulated color filter array pattern to be shifted between two different states.

FIG. 7 illustrates an embodiment of the present invention that permits a color filter array pattern to be switched between two different states. Array 170 is configured to include four color detector groups in two rows and two columns, with each color detector group 172-1 through 172-4 having circuitry for collecting two colors that share a common column output line 174-1 and 174-2. Row selection lines RowA and RowB connect to the gates of selection transistors and control the selection of the detector group outputs onto the shared column lines. The RowA and RowB lines are connected such that the color filter array pattern can be switched between two different states corresponding to RowA or RowB. In either state, only one color per pixel location is read out, but the color read from the pixel location is determined by which of the row selection lines is used. In the case of FIG. 7, RowA selects blue and green data in the first row, and green and red data in the second row. Using RowB instead of RowA selects green and red in the first row, and blue and green in the second row.

It should be evident from the drawing and explanation of FIG. 7 that the array of detector groups shown can be part of a larger N×M array of detector groups, wherein N and M are any desired numbers and the RowA and RowB selection can be controlled by a decoder or other sequencing circuit thereby allowing an array of such detector groups to switch between color filter array patterns through electronic or software control. Switching of the pattern can be used to increase the resolution in the interpolated image by reading multiple color sub-sampled images that have a different arrangement of the color filter pattern, and subsequently combining these images in processing hardware or software using a suitable image reconstruction algorithm. Additionally, the ability to program the pattern may simplify integration of the color detector groups 172-1 through 172-4 with system components that are configured to function with a particular orientation of the color filter array pattern data.

As illustrated in FIGS. 8A–8D, multiple detector groups 172 can be covered optionally with color filters represented by a large X within the color detector group. The color filters indicated by the X markers can be organic dye filters, dielectric filters, polysilicon filters or other types of color filters. The detector groups of FIGS. 8A–8D employ the same design as depicted by the circuit in FIG. 7. In FIGS. 8A–8D, the color readout selection capability is depicted by the B/G and G/R indicated at each detector group location. The B/G indicates a detector group capable of reading out blue or green, based on the row selection inputs, and the G/R indicates the ability to read out green or red, based on the row selection inputs. In a preferred embodiment depicted in FIG. 8A, color filters are distributed among color detector groups in pairs offset by two pixels per row, and where on alternating rows the color filters are offset from the filters of the previous row by two pixels. This arrangement results in a pattern where all combinations of color detector group and color filter are present. FIGS. 8B–8D depict other arrangements of color filters with color detector groups of the type shown in FIG. 7, showing the ability arrange the array to read out different colors in different orders and using color filter patterns in conjunction with the different arrangements of color detector groups. In all cases the B/G and R/G notation is used to indicate that by using row selection circuitry, the order of color read out can be chosen.

Figure 9:
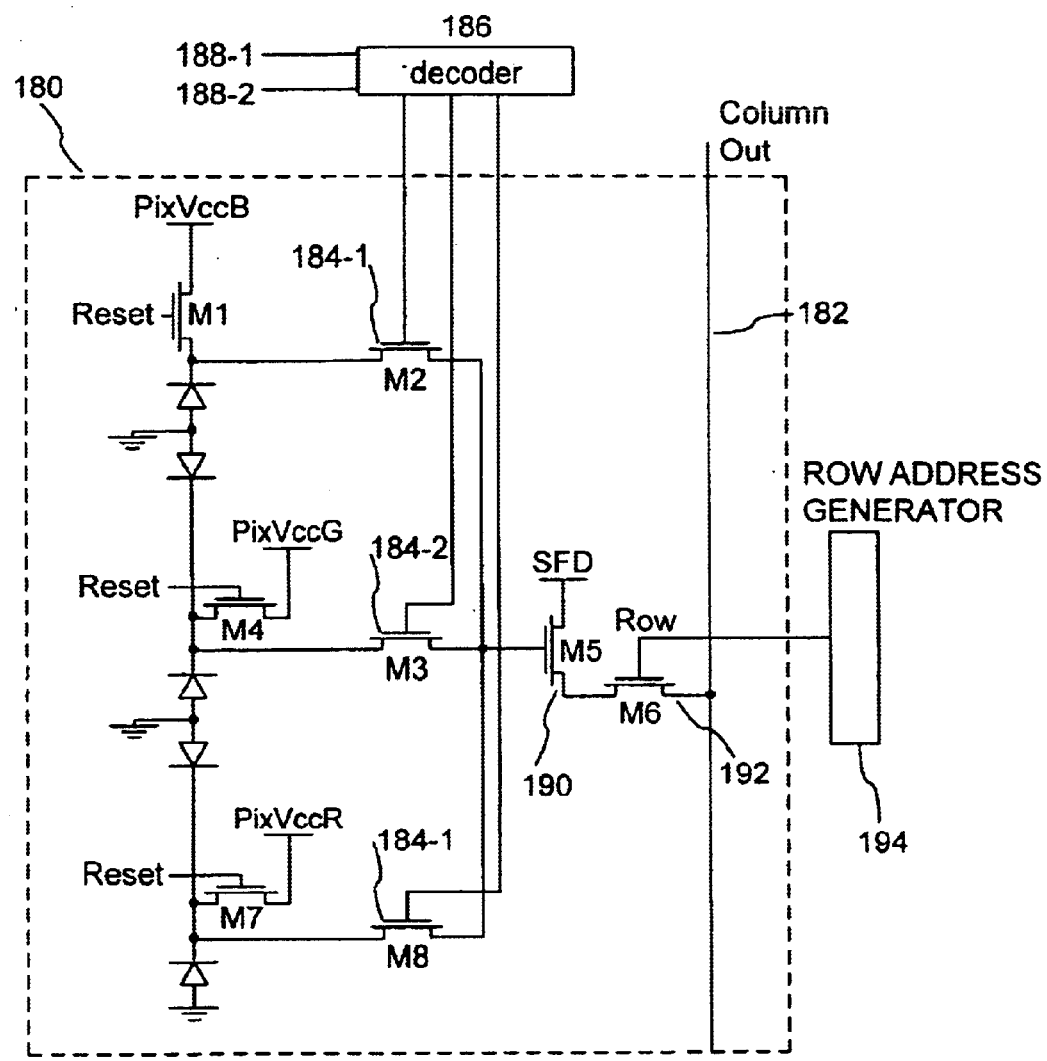
FIG. 9 is a schematic of a color detector group multiplexed to a single column output line.

FIG. 9 illustrates a color detector group 180 wherein in the output signals for each color channel are multiplexed to a single column output line 182. Circuits 184-1 through 184-3 of the detector group 180 are connected to a decoder 186, which activates the individual circuits based on a combination of signals along the two input lines 188-1 an 188-2. For example, sending a zero value on line 188-1 and a zero value on line 188-2 can activate circuit 184-1. Other combinations of the values of zero and one can address circuits 184-2 and 184-3, while a one value on both lines 188-1, 188-2 can activate all circuits 1841 through 184-3 simultaneously, resulting in a monochrome output. Once the decoder 186 has activated the desired circuits, the detector output signals are amplified by the source follower 190 and can be selected onto the column output line 182 by row select circuit 192 controlled by a row address generator 194.

Figure 10:
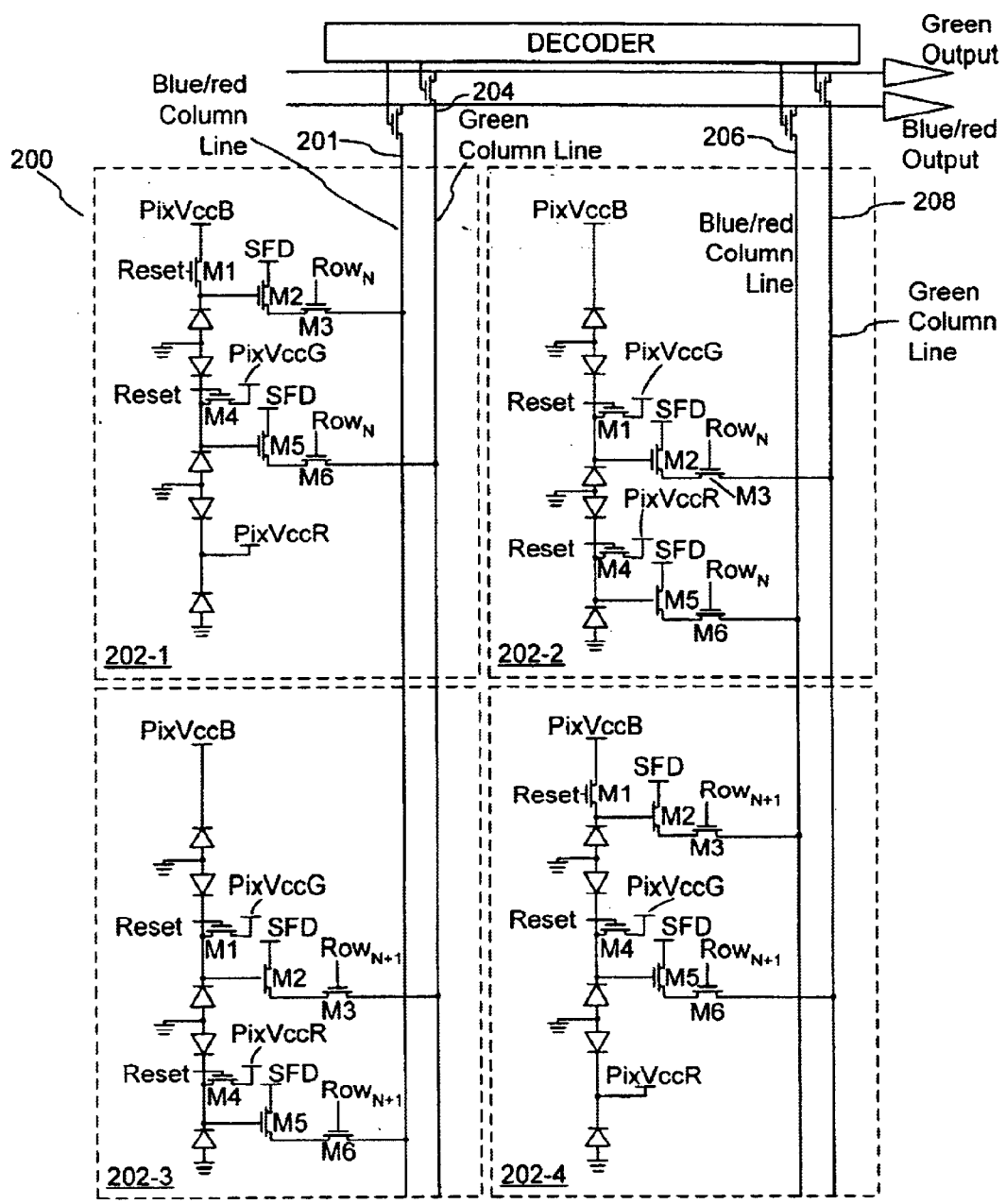
FIG. 10 is a schematic of a mosaic of color detector groups configured to collect two out of three colors per pixel location.

FIG. 10 illustrates an array 200 of color detector groups 202-1 through 202-4. Array 200 is able to read out two colors per pixel location, by including two column output lines in each color detector group 202-1 through 202-4. Column output lines 201 and 206 connect to both blue and red detector outputs via the row select transistors, and column output lines 204 and 208 are connected only to green. The column output lines for each column of detector groups can be selected onto output buses by means of a decoder and switches, one bus corresponding to the red/blue data, and one bus corresponding to the green data. In this embodiment, array 200 is configured in a manner that is similar to a Bayer pattern, but has the additional benefit that there is a green sensor at every pixel location, rather than in only half the locations as is the case in color filter arrays that employ conventional Bayer patterns. This type of array allows for very high resolution and reduced color aliasing artifacts because of the higher sampling rate in the green channel. Additionally, each pixel location requires only six transistors as opposed to nine for a fully accessed array, since one color in each color detector group 202-1 through 202-4 is not collected. The reduced number of transistors allows for an increased fill factor or a reduced pixel size. Both of these benefits may be realized in systems that require smaller higher performance image sensors.

As illustrated in FIGS. 11A and 11B multiple detector groups 202 can be covered optionally with color filters represented by a large X within the color detector group. The color filters indicated by the X markers can be organic filters, dielectric filters, polysilicon filters or other types of color filters. The color detector groups of FIGS. 11A and 11B employ the same design as that depicted by FIG. 10. The letters within each square are representative of the color detectors that are connected to the column output lines of the array so that a detector group with the label BG has the blue and green detector outputs connected, through row selection transistors, to the two column output lines that traverse the entire column of detector groups and a detector group with the label GR has the green and red detector outputs connected, through row selection transistors, to the two column output lines that traverse the entire column of detector groups. In a preferred embodiment indicated by FIGS. 11A and 11B, color filters are distributed among color detector groups in pairs offset by two detector groups per row, and where on alternating rows the color filters are offset from the filters of the previous row by two detector groups. This arrangement results in a pattern where all combinations of color detector groups and color filters are present. FIG. 11A illustrates an embodiment where the array of color detector groups begins with a blue/green detector group, and FIG. 11B illustrates and embodiment where the array of color detector groups begins with a green/red detector group. In both embodiments, alternate rows begin with a different detector group combination, thereby alternating the blue/green and red/green detector groups. It is also possible to create arrays of such detector groups wherein the first detector group of each row is of the same type.

Figure 12:
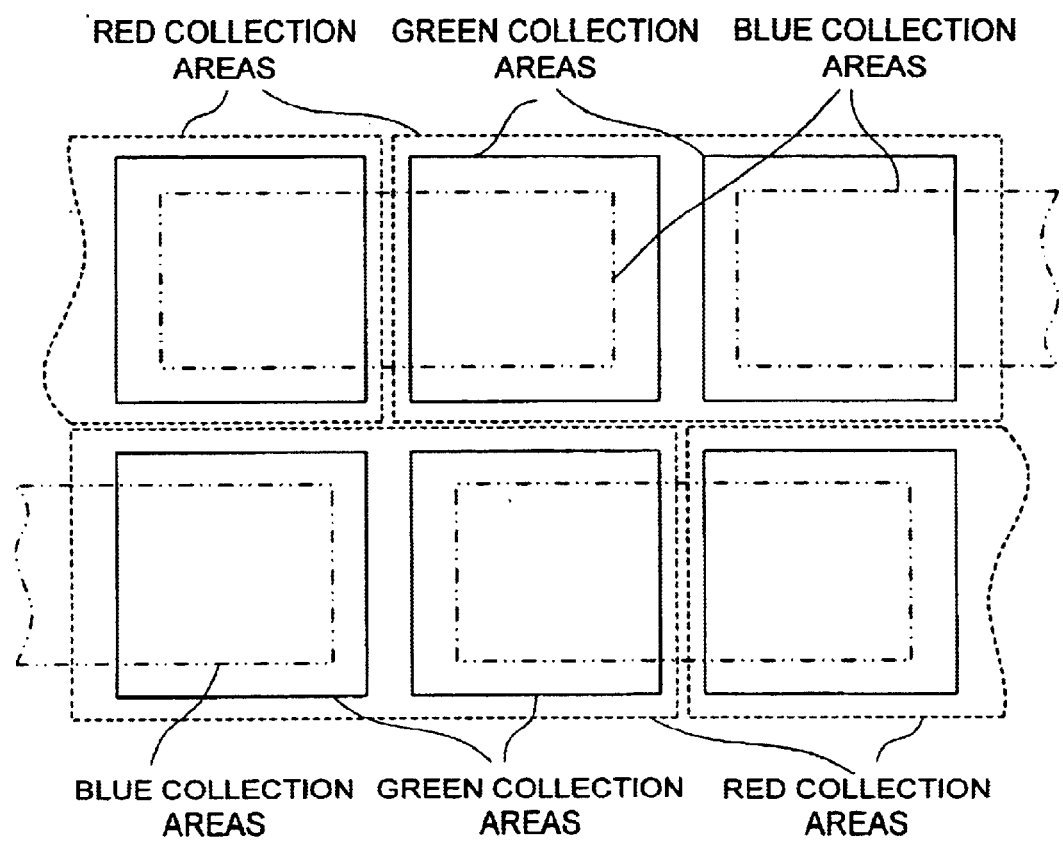
FIG. 12 is an illustration of larger blue and red collection areas used in connection with color detection groups.

In an embodiment of the present invention, arrays of color detector groups can be configured with larger collection areas for blue and red than the collection area for green. As illustrated in FIG. 12, every pixel cell location has a green sensor active. Charges from adjacent blue and red sensors are combined in alternating fashion, resulting in a color filter array-like device with twice the signal in the red and blue channels. This type of array increases the signal to noise ratio in the blue and red channels while maintaining high spatial resolution in the luminance channel. The high luminance resolution is achieved because every pixel location has an active green sensor, as opposed to a typical color filter array that has a green sensor at only half of the pixel locations. Those of ordinary skill in the art will recognize that maintaining high luminance resolution through the higher sampling rate in the green channel will reduce the presence of aliasing artifacts in interpolated images generated with such a sensor. Additionally, larger blue and red collection areas further reduce the presence of aliasing artifacts. While the blue, green and red pixels are illustrated in FIG. 12 as having different areas, this is not a requirement of the array, but is illustrated to indicate the arrangement of sensors.

FIG. 13 illustrates a schematic for the preferred implementation of the array shown in FIG. 12. Array 220 is one of several ways in which signals can be routed to create an array that uses color sub-sampling in combination with signal summation in two of the color channels, but full sampling in a third channel. In array 220, there are two column output lines per pixel location, but it is possible to use three column output lines per location in the case that better chip layout and routing can be implemented. The pixel circuit shown in FIG. 12 is a simple three-transistor active pixel circuit per color channel, but other pixel circuits can also be used in array 220. In FIG. 13, the output from the green detector of each detector group is connected to one of the column output lines that correspond to each column of detector groups, and the other column output line is connected to the summed output signal from two adjacent blue or red detectors. The arrangement of connections of blue and red sensors is such that whichever of the blue or red is connected first on a given row, the other color will be the first one connected on the following row, making the pattern of blue and red readout locations appear like a checkerboard, with corresponding detector areas two elements wide and one element high. Those of ordinary skill in the art will recognize that the orientation of the array is arbitrary, and the terms width and height can be interchanged in conjunction with suitable changes to circuitry. In addition, the arrangement of color detectors can be altered to form other color filter array patterns or to share column output lines among detectors of different colors than indicated in FIG. 13. FIGS. 12 and 13 also indicate that the method of connecting the detectors which are shared can be either through the use of wires to form electrical connections (shown in FIG. 13) or by creating photodetector layers that are of different sizes (shown in FIG. 12).

The color detector group 10 and color detector group 150, including the above array implementations, can be combined with traditional color filter arrays that employ organic or other types of absorbing or reflecting filters such as dielectric filters or polysilicon filters. Such filters can be placed directly on the image sensor above the plane of the semiconductor substrate as is well known in the art. Various combinations of color filters and the color detector groups of the present invention can be constructed to provide improved photon efficiency, color accuracy, and sensor resolution. For example, an array of color detector groups such as the one depicted in FIG. 6 can be combined with organic color filters of the type typically used in image sensor manufacturing. Color filters could be formed on the device in a checkerboard-like pattern to tune the color response of the detector groups that are responsive to blue and red illumination. In this case, the filter properties of the color filter could be very simple and much less sensitive to manufacturing variations due to the fact that the color filter works in conjunction with the semiconductor color filter properties. The advantage gained is a potentially more desirable color filter response. Alternatively, the organic, dielectric, or polysilicon filters could be placed on top of the detector groups in an alternating arrangement such that every other detector group that responds to a particular color also has a color filter that serves to shape the color response, thereby creating an array with six distinct color responses. This method allows for a large variety of color responses while minimizing the manufacturing overhead associated with the process of placing organic or other types of color filters, such as dielectric filters or polysilicon layers, on top of the image sensor surface.

The best modes of the present inventions have been described. While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A color detector group formed on a semiconductor substrate, comprising:
    at least three detector layers configured to collect photo-generated carriers, wherein said detector layers are disposed substantially in a vertical alignment with respect to each other and wherein each of the detector layers is sensitive to illumination to a range of colors;
    circuitry for converting the photogenerated carriers collected by only one of the detectors into an electrical signal; and a column output line for delivering the electrical signal to an output bus.

2. A plurality of color detector groups of claim 1, configured into an array having at least two rows and at least two columns, the circuitry and column output lines of adjacent detector groups connected to detector layers that correspond to different colors such that the plurality of detector groups substantially emulates a color filter array pattern.

3. The plurality of color detector groups of claim 2, wherein the emulated color filter array pattern is a Bayer pattern.

4. The color detector group of claim 1, wherein the electrical signals are current signals.

5. The color detector group of claim 1, wherein the electrical signals are voltage signals.

6. The color detector group of claim 1, further comprising a color filter disposed above the color detector group.

7. The color detector group of claim 6, wherein the color filter comprises an organic color filter.

8. The color detector group of claim 6, wherein the color filter comprises a dielectric color filter.

9. The color detector group of claim 6, wherein the color filter comprises a polysilicon layer.

10. A color detector group formed on a silicon substrate and comprising:

at least three detector layers configured to collect photogenerated carriers, wherein the detector layers are disposed substantially in a vertical alignment with respect to each other, wherein each of said detector layers is sensitive to illumination of a range of colors;

two converting circuits for converting photogenerated carriers collected by only a corresponding two of the detector layers into electrical signals; and first and second column output lines for delivering the electrical signals to an output bus.

11. The color detector group of claim 10, wherein the electrical signals are current signals.

12. The color detector group of claim 10, wherein the electrical signals are voltage signals.

13. The color detector group of claim 10, further comprising a color filter disposed above said detector group.

14. The color detector group of claim 13, wherein the color filter comprises an organic color filter.

15. The color detector group of claim 13, wherein the color filter comprises a dielectric color filter.

16. The color detector group of claim 13, wherein the color filter comprises a polysilicon layer.

* * * * *